United States Patent
Wang et al.

(10) Patent No.: US 10,254,609 B2
(45) Date of Patent: Apr. 9, 2019

(54) ARRAY SUBSTRATE INCLUDING PIXEL ELECTRODE AND DRAIN ELECTRODE IN DIRECT CONTACT TO EACH OTHER, AND METHOD OF MANUFACTURING THE SAME, DISPLAY PANEL, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Huibin Guo, Beijing (CN); Yuchun Feng, Beijing (CN); Liangliang Li, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/525,979

(22) PCT Filed: May 25, 2016

(86) PCT No.: PCT/CN2016/083241
§ 371 (c)(1),
(2) Date: May 11, 2017

(87) PCT Pub. No.: WO2017/140058
PCT Pub. Date: Aug. 24, 2017

(65) Prior Publication Data
US 2018/0341158 A1    Nov. 29, 2018

(30) Foreign Application Priority Data
Feb. 18, 2016    (CN) .......................... 2016 1 0091331

(51) Int. Cl.
*H01L 27/12* (2006.01)
*G02F 1/1362* (2006.01)
(Continued)

(52) U.S. Cl.
CPC ...... *G02F 1/136227* (2013.01); *G02F 1/1368* (2013.01); *G02F 1/134363* (2013.01);
(Continued)

(58) Field of Classification Search
CPC .......................... H01L 27/124; G02F 1/136227
(Continued)

(56) References Cited

U.S. PATENT DOCUMENTS

| 9,323,100 B1* | 4/2016 | Feng | G02F 1/133514 |
| 2002/0022307 A1* | 2/2002 | Park | H01L 21/67207 |
| | | | 438/149 |

(Continued)

FOREIGN PATENT DOCUMENTS

| CN | 1475983 A | 2/2004 |
| CN | 1728345 A | 2/2006 |

(Continued)

OTHER PUBLICATIONS

Second Office Action for Chinese Application No. 201610091331.X, dated May 24, 2018, 8 Pages.

(Continued)

*Primary Examiner* — Jami Valentine Miller
(74) *Attorney, Agent, or Firm* — Brooks Kushman P.C.

(57) ABSTRACT

An array substrate and a method of manufacturing the same, a display panel and a display device are provided. The array substrate includes a thin film transistor and a pixel electrode. An insulating layer is formed between a drain electrode of the thin film transistor and the pixel electrode. The drain (Continued)

electrode is in direct electrical contact with the pixel electrode through a via-hole in the insulating layer.

8 Claims, 5 Drawing Sheets

(51) Int. Cl.
  *H01L 21/77* (2017.01)
  *G02F 1/1343* (2006.01)
  *G02F 1/1368* (2006.01)
  *H01L 29/49* (2006.01)

(52) U.S. Cl.
  CPC .............. *H01L 21/77* (2013.01); *H01L 27/12* (2013.01); *H01L 27/124* (2013.01); *H01L 27/127* (2013.01); *H01L 27/1288* (2013.01); *H01L 29/4908* (2013.01); *G02F 2001/13685* (2013.01); *G02F 2001/134318* (2013.01); *G02F 2001/136236* (2013.01); *G02F 2201/121* (2013.01); *G02F 2201/123* (2013.01)

(58) Field of Classification Search
  USPC .......................................................... 257/72
  See application file for complete search history.

(56) References Cited

U.S. PATENT DOCUMENTS

| 2004/0004443 A1 | 1/2004 | Park et al. | |
|---|---|---|---|
| 2006/0024957 A1 | 2/2006 | Harada et al. | |
| 2011/0266542 A1* | 11/2011 | Ryu | H01L 27/1225 257/57 |
| 2013/0001583 A1* | 1/2013 | Yamazaki | G02F 1/13454 257/72 |
| 2013/0088672 A1* | 4/2013 | Shin | G02F 1/133512 349/110 |
| 2014/0138685 A1* | 5/2014 | Zhang | H01L 22/32 257/48 |
| 2014/0340605 A1* | 11/2014 | Takeda | G02F 1/134363 349/43 |
| 2015/0077753 A1* | 3/2015 | Ji | G09G 3/006 356/402 |
| 2016/0111442 A1* | 4/2016 | Wu | H01L 27/124 257/72 |
| 2016/0181278 A1* | 6/2016 | Choi | H01L 29/458 257/72 |

FOREIGN PATENT DOCUMENTS

| CN | 102709283 A | 10/2012 |
|---|---|---|
| CN | 103208491 A | 7/2013 |
| CN | 103872040 A | 6/2014 |
| CN | 105552028 A | 5/2016 |

OTHER PUBLICATIONS

First Office Action for Chinese Application No. 201610091331.X, dated Jan. 3, 2018, 7 Pages.

International Search Report and Written Opinion for Application No. PCT/CN2016/083241, dated Nov. 23, 2016, 11 Pages.

* cited by examiner

ARRAY SUBSTRATE INCLUDING PIXEL ELECTRODE AND DRAIN ELECTRODE IN DIRECT CONTACT TO EACH OTHER, AND METHOD OF MANUFACTURING THE SAME, DISPLAY PANEL, AND DISPLAY DEVICE

CROSS-REFERENCE TO RELATED APPLICATIONS

This application is the U.S. national phase of PCT Application No. PCT/CN2016/083241 filed on May 25, 2016, which claims priority to Chinese Patent Application No. 201610091331.X filed on Feb. 18, 2016, the disclosures of which are incorporated in their entirety by reference herein.

TECHNICAL FIELD

The present disclosure relates to the field of display technology, and in particular to an array substrate and a method of manufacturing the same, a display panel and a display device.

BACKGROUND

Thin film transistor-liquid crystal displays (TFT-LCDs) have small sizes, low power consumption, and are free of radiation, which have been rapidly developed in recent years and are dominant in the current flat panel display market. The major component of the TFT-LCD is a liquid crystal panel which includes a backlight, a thin film transistor array substrate and a color filter substrate that are oppositely arranged to form a cell, and liquid crystal molecules arranged between the array substrate and the color filter substrate. The array substrate includes a plurality of gate lines and a plurality of data lines that are distributed in a crossing manner to define a plurality of pixel regions.

SUMMARY

The present disclosure provides a High Aperture Ratio Advanced Super Dimension Switch (H-ADS) array substrate and a method of manufacturing the same, a display panel and a display device, to solve the technical issue that poor transmission contact and a sharp decline in product yield are probably caused by the electrical connection of the drain electrode of the thin film transistor and the pixel electrode in the related art.

To solve the above-mentioned technical issue, a method of manufacturing an array substrate is provided in the present disclosure, including a plurality of pixel regions. The method includes:

providing a base substrate;

forming a thin film transistor and a pixel electrode in each of the pixel regions;

forming an insulating layer between a drain electrode of the thin film transistor and the pixel electrode, the forming an insulating layer includes:

forming in the insulating layer a via-hole through which the drain electrode is in direct electrical contact with the pixel electrode.

An array substrate is further provided in the present disclosure, including a plurality of pixel regions. Each of the pixel regions includes a thin film transistor and a pixel electrode arranged on a base substrate. The array substrate further includes an insulating layer between a drain electrode of the thin film transistor and the pixel electrode. The insulating layer includes a via-hole through which the drain electrode is in direct electrical contact with the pixel electrode.

A display panel is further provided in the present disclosure, including the above-mentioned array substrate.

A display device is further provided in the present disclosure, including the above-mentioned array substrate.

According to the above technical solutions in the present disclosure, the drain electrode of the thin film transistor is in direct electrical contact with the pixel electrode through the via-hole, so the connection between the drain electrode and the pixel electrode is good and the contact there between may not be poor, thereby improving the product yield.

BRIEF DESCRIPTION OF THE DRAWINGS

In order to illustrate the embodiments of the present disclosure or the technical solutions in the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In the thin film transistor liquid crystal display in the related art, each pixel region includes a pixel electrode and a thin film transistor. A gate electrode of the thin film transistor is connected to a gate line, a source electrode of the thin film transistor is connected to a data line, and a drain electrode of the thin film transistor is connected to the pixel electrode. As a switching component, the thin film transistor is used to control the pixel electrode and the common electrode to form an electric field for driving the liquid crystals to rotate and thus realize display.

In terms of a direction of the electric field for driving liquid crystals, the TFT-LCDs are categorized into a vertical electric field TFT-LCD and a horizontal electric field TFT-LCD. A common electrode of the vertical electric field TFT-LCD is arranged on a color filter substrate, such as twisted nematic (TN) TFT-LCD. A common electrode of the horizontal electric field TFT-LCD is arranged on the array substrate, such as Advanced Super Dimension Switch (ADS) TFT-LCD. The H-ADS technology may improve the image quality of the display device, and has a high resolution, a high transmittance, low power consumption, a wide viewing angle, a high aperture ratio, a low aberration, and is free of squeezed ripple (push Mura).

For different applications, the ADS technology has been developed into an Innovative Advanced Dimension Switch (I-ADS) technology having a high transmittance, a High Aperture Ratio Advanced Super Dimension Switch (H-ADS) technology having a high aperture ratio, and an (S-ADS) technology having a high resolution, etc. The H-ADS technology-based array substrate includes a plate-like pixel electrode and a slit common electrode. In the H-ADS array substrate in the related art, the drain electrode of the thin film transistor and the pixel electrode are arranged at different layers. To be specific, the drain electrode and the pixel electrode are connected in the following manner: after the thin film transistor is manufactured, via-holes are formed to expose the drain electrode of the thin film transistor and the pixel electrode, and then a transparent conductive pattern is formed during the manufacturing process of the slit common electrode. The transparent conductive pattern is electrically connected to both the exposed drain electrode and the pixel electrode, thereby realizing the connection of the drain electrode and the pixel electrode. However, the drain electrode and the pixel electrode are connected through a third conductive layer, which may probably cause poor transmission contact and a sharp decline in product yield.

Figure 1:
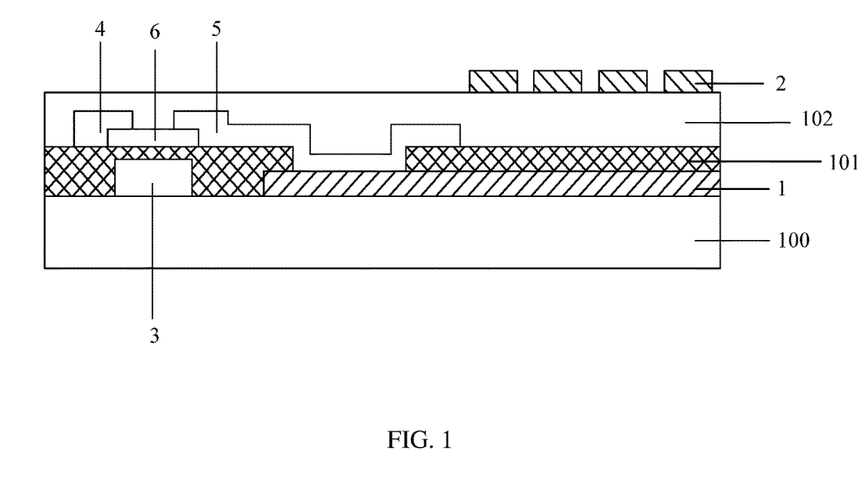
FIG. 1 is a schematic view of an H-ADS array substrate of a bottom-gate thin film transistor in some embodiments of the present disclosure.
Figure 2:
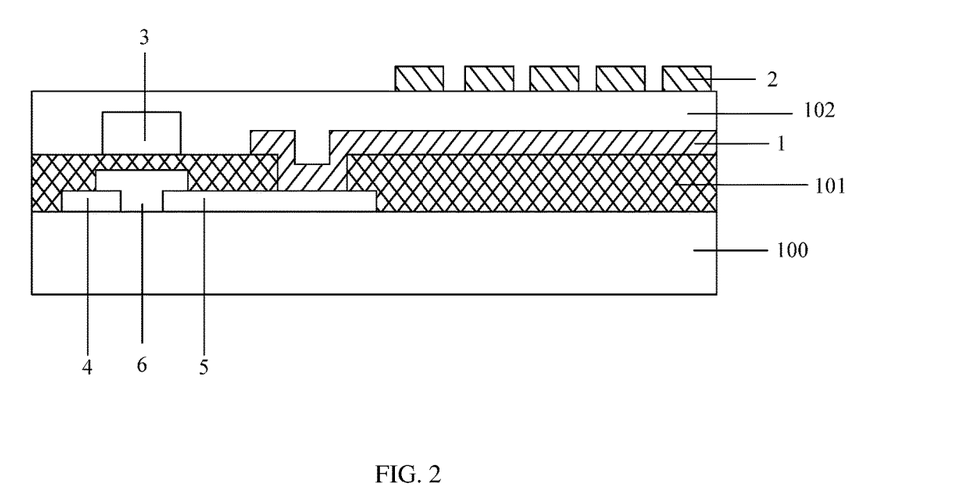
FIG. 2 is a schematic view of an H-ADS array substrate of a top-gate thin film transistor in some embodiments of the present disclosure.
Figure 3:
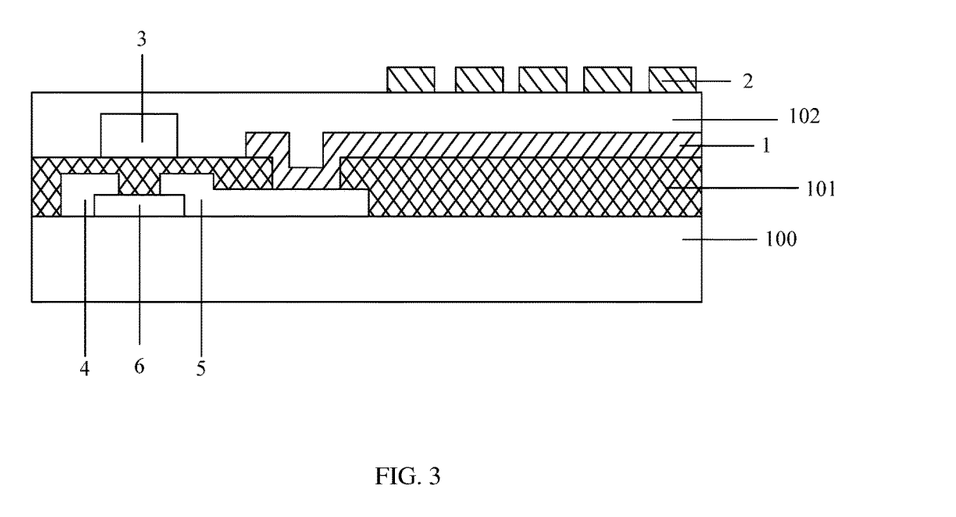
FIG. 3 is a schematic view of an H-ADS array substrate of a coplanar top-gate thin film transistor in some embodiments of the present disclosure.

As shown in FIGS. 1-3, the present disclosure provides in some embodiments a method of manufacturing a display substrate including a plurality of pixel regions. The method includes:

providing a base substrate 100;

forming a thin film transistor and a pixel electrode 1 in each of the pixel regions;

forming an insulating layer 101 between a drain electrode 5 of the thin film transistor and the pixel electrode 1. The step of forming the insulating layer 101 includes:

forming in the insulating layer 101 a via-hole through which the drain electrode 5 is in direct electrical contact with the pixel electrode 1.

In the array substrate manufactured by the above-mentioned method, the drain electrode 5 of the thin film transistor is in direct electrical contact with the pixel electrode 1 through the via-hole, so the connection between the drain electrode and the pixel electrode is good and the contact there between may not be poor, thereby improving the product yield.

The direct electrical contact between the drain electrode 5 and the pixel electrode 1 through the via-hole in the insulating layer 101 refers to: in the case that the drain electrode 5 is arranged at a side of the insulating layer 101 away from the substrate 100, part of the pixel electrode 1 is exposed through the via-hole in the insulating layer 101, and part of the drain electrode 5 is inserted into the via-hole and is in electrical contact with the pixel electrode 1. In the case that the drain electrode 5 is arranged at a side of the insulating layer 101 near the substrate 100, part of the drain electrode 5 is exposed through the via-hole in the insulating layer 101, and part of the pixel electrode 1 is inserted into the via-hole and is in electrical contact with the drain electrode 5.

Optionally, only one insulating layer 101 is arranged between the drain electrode 5 of the thin film transistor and the pixel electrode 1, and the via-hole formed in the insulating layer 101 is a shallow via-hole (i.e., a via-hole penetrating through one insulating layer), so the undercutting, which is caused by etching multiple insulating layers, may not occur, thereby further guaranteeing a good transmission contact between the drain electrode 5 and the pixel electrode 1.

In some embodiments of the present disclosure, the insulating layer 101 between the drain electrode 5 of the thin film transistor and the pixel electrode 1 is a gate insulating layer.

The technical solution of the present disclosure is applicable to all kinds of thin film transistor array substrates, such as bottom-gate thin film transistor array substrates (as shown in FIG. 1), top-gate thin film transistor array substrates (as shown in FIG. 2), and coplanar top-gate thin film transistor array substrates (as shown in FIG. 3).

Certainly, the technical solution of the present disclosure is also applicable to horizontal electric field array substrates and vertical electric field array substrates.

The technical solution of the present disclosure will be specifically discussed by taking the H-ADS array substrate as an example.

Figure 4:
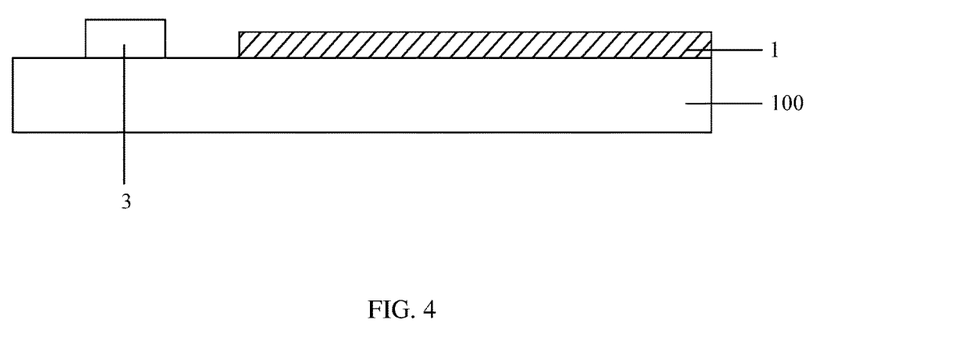
FIGS. 4-8 show a manufacturing process of the H-ADS array substrate in FIG. 1.
Figure 5:
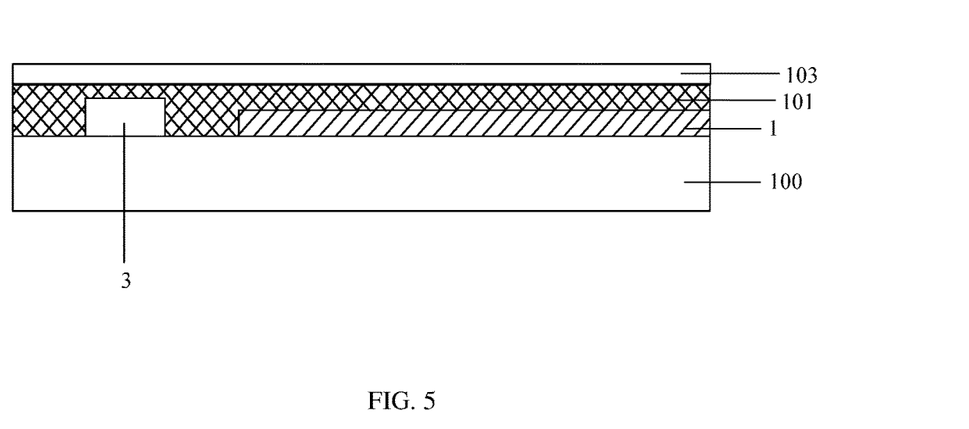
Figure 7:
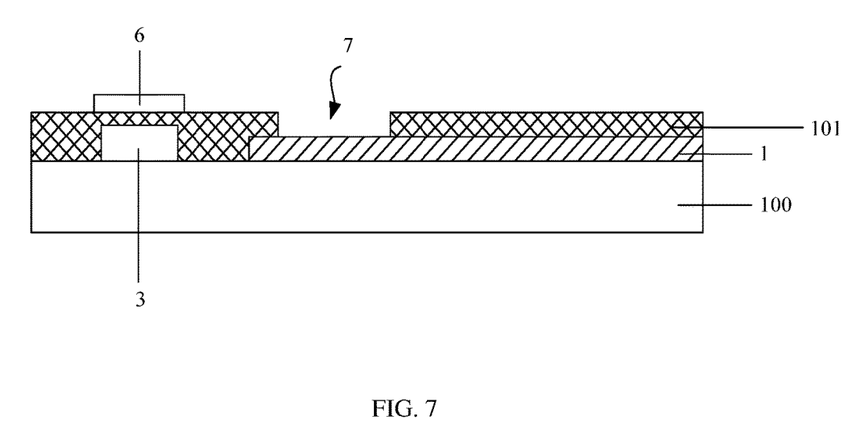
Figure 8:
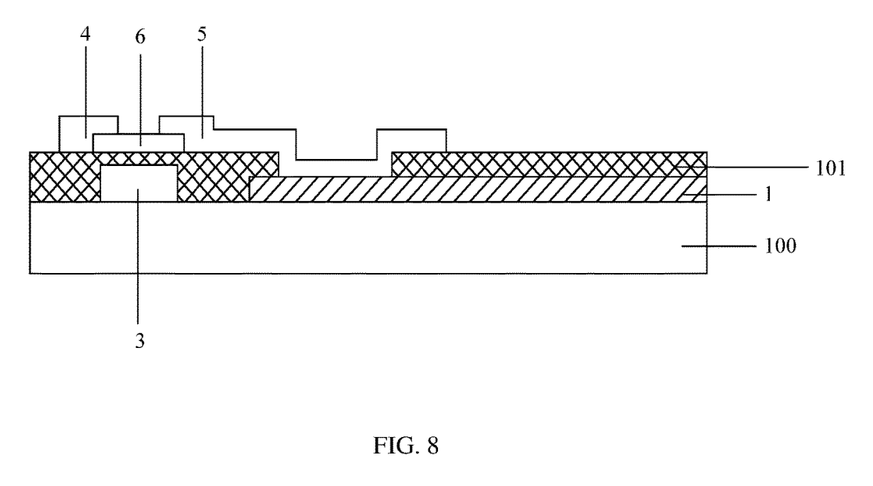

As shown in FIG. 1, for a bottom-gate thin film transistor array substrate, the gate insulating layer 101 and the active layer 6 of the thin film transistor are formed by one patterning process to simplify the manufacturing process. In this case, the method of manufacturing the H-ADS array substrate includes:

providing a transparent base substrate 100, such as a glass substrate, a quartz resin substrate, and an organic resin substrate;

forming a gate electrode 3 and a plate-like pixel electrode 1 on the base substrate 100, as shown in FIG. 4;

forming a gate insulating layer 101 covering the gate electrode 3 and the pixel electrode 1, as shown in FIG. 5;

forming a semiconductor layer 103 on the gate insulating layer 101, as shown in FIG. 5, patterning the semiconductor layer 103 and the gate insulating layer 101 by one patterning process to form an active layer 6 of the thin film transistor, and forming a via-hole 7 in the gate insulating layer 101 to expose part of the pixel electrode 1, as shown in FIG. 7;

forming a source electrode 4 and a drain electrode 5 directly lapped onto two ends of the active layer 6 respectively, where part of the drain electrode 5 is inserted into the via and in direct electrical contact with the pixel electrode 1, as shown in FIG. 8;

forming a passivation layer 102 covering the thin film transistor, as shown in FIG. 1; and forming a slit common electrode 2 on the passivation layer 102, as shown in FIG. 1.

Through the above process, the bottom-gate thin film transistor array substrate is formed.

Optionally, the passivation layer 102 is a thick organic film layer, which may provide a planar surface for the array substrate.

Figure 6:
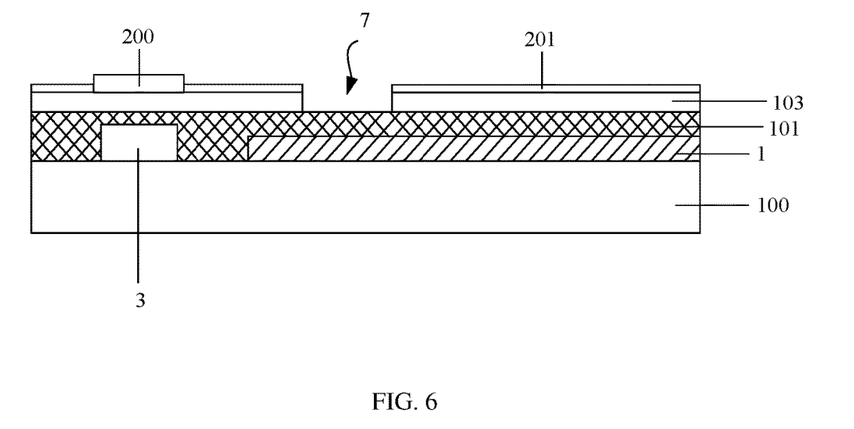

As shown in FIGS. 6 and 7, the step of pattering the semiconductor layer 103 and the gate insulating layer 101 by one patterning process includes:

coating the semiconductor layer 101 with a photoresist, exposing the photoresist using a grey tone mask plate or a half tone mask plate to form a photoresist fully-reserved region 200, a photoresist partially-reserved region 201 and a photoresist fully-unreserved region, where the photoresist fully-reserved region 200 corresponds to the region where the active layer 6 is located, the photoresist fully-unreserved region corresponds to the region where the via-hole 7 in the gate insulating layer 101 is located, and the photoresist partially-reserved region 201 corresponds to other regions;

removing the semiconductor layer 103 and the gate insulating layer 101 at the photoresist fully-unreserved region, to form the via-hole 7;

removing the photoresist at the photoresist partially-reserved region 201 through an ashing process, as shown in FIG. 6;

removing the semiconductor layer 103 at the photoresist partially-reserved region 201; and peeling off the remaining photoresist, to form the active layer 6 of the thin film transistor, as shown in FIG. 7.

As shown in FIG. 2, for a top-gate thin film transistor array substrate, the gate insulating layer 101 and the gate electrode 3 of the thin film transistor are formed by one patterning process to simplify the manufacturing process. In this case, the method of manufacturing the H-ADS array substrate includes:

providing a transparent base substrate 100, such as a glass substrate, a quartz resin substrate, and an organic resin substrate;

forming a source electrode 4 and a drain electrode 5 on the substrate 100;

forming an active layer 6, where two ends of the active layer 6 are directly lapped onto the source electrode 4 and the drain electrode 5 respectively;

forming a gate insulating layer 101 covering the active layer 6, the source electrode 4 and the drain electrode 5;

forming a gate metal layer on the gate insulating layer 101, patterning the gate insulating layer 101 and the gate metal layer by one patterning process to form a gate electrode 3 of the thin film transistor, and forming a via-hole in the gate insulating layer 101 to expose part of the drain electrode 5;

forming a plate-like pixel electrode 1, where part of the plate-like pixel electrode 1 is inserted into the via-hole in the gate insulating layer 101 and is in direct electrical contact with the drain electrode 5;

forming a passivation layer 102 covering the gate electrode 3 and the pixel electrode 1; and forming a slit common electrode 2 on the passivation layer 102.

Through the above process, the top-gate thin film transistor array substrate is formed.

Optionally, the passivation layer 102 is a thick organic film layer, which may provide a planar surface for the array substrate.

The step of patterning the gate insulating layer 101 and the gate metal layer by one patterning process includes:

coating the gate metal layer with a photoresist, exposing the photoresist using a grey tone mask plate or a half tone mask plate to form a photoresist fully-reserved region, a photoresist partially-reserved region and a photoresist fully-unreserved region, where the photoresist fully-reserved region corresponds to the region where the gate electrode is located, the photoresist fully-unreserved region corresponds to the region where the via-hole is located, and the photoresist partially-reserved region corresponds to other regions;

removing the gate metal layer and the gate insulating layer at the photoresist fully-unreserved region, to form the via-hole;

removing the photoresist at the photoresist partially-reserved region through an ashing process;

removing the gate metal layer at the photoresist partially-reserved region; and peeling off the remaining photoresist, to form the gate electrode of the thin film transistor.

As shown in FIG. 3, for a coplanar top-gate thin film transistor array substrate, the gate insulating layer 101 and the gate electrode 3 are formed by one patterning process to simplify the manufacturing process. In this case, the method of manufacturing the H-ADS array substrate includes:

providing a transparent base substrate 100, such as a glass substrate, a quartz resin substrate, and an organic resin substrate;

forming an active layer 6 of the thin film transistor on the substrate 100;

forming a source electrode 4 and a drain electrode 5 of the thin film transistor which are directly lapped onto two ends of the active layer 6 respectively;

forming a gate insulating layer 101 covering the active layer 6, the source electrode 4 and the drain electrode 5;

forming a gate metal layer on the gate insulating layer 101, patterning the gate metal layer and the gate insulating layer by one patterning process, to form a gate electrode 3 of the thin film transistor, and forming a via-hole in the gate insulating layer 101 to expose part of the drain electrode 5;

forming a plate-like pixel electrode 1, where part of the plate-like pixel electrode is inserted into the via-hole in the gate insulating layer 101 and is in direct electrical contact with the drain electrode 5;

forming a passivation layer 102 covering the gate electrode 3 and the pixel electrode 1; and forming a slit common electrode 2 on the passivation layer 102.

Through the above process, the manufacture of the coplanar top-gate thin film transistor array substrate is formed.

Optionally, the passivation layer 102 is a thick organic film layer, which may provide a planar surface for the array substrate.

The specific steps for patterning the gate metal layer and the gate insulating layer 101 by one patterning process are the same as those for the top-gate thin film transistor array substrate, and the description thereof is omitted herein.

In some embodiments of the present disclosure, the material of the active layer 6 of the thin film transistor may be a silicon semiconductor (poly silicon or amorphous silicon may be used) or a metal oxide semiconductor (one or more of amorphous HIZO, ZnO, $TiO_2$, CdSnO, MgZnO, IGO, IZO, ITO or IGZO may be used). The material of the gate electrode 3, the source electrode 4 and the drain electrode 5 is Cu, Al, Ag, Mo, Cr, Nd, Ni, Mn, Ti, Ta, W and other metals, and alloys of these metals, the gate electrode 3, the source electrode 4 and the drain electrode 5 may be of a single-layer structure or a multi-layer structure such as Cu\Mo, Ti\Cu\Ti, Mo\Al\Mo, etc. The materials of the pixel electrode 1 and the common electrode 2 may transparent metal oxide, such as HIZO, ZnO, $TiO_2$, CdSnO, MgZnO, IGO, IZO, ITO or IGZO.

The material of the gate insulating layer 101 may be selected from the group consisting of organic material or inorganic material such as oxide, nitride or nitrogen oxide, and the gate insulating layer 101 may be of a single layer structure, a double layer structure, or a multiple layer structure. Optionally, the gate insulating layer 101 is an organic film layer. The organic film layer is thick, then the via-hole formed therein may have a large size, therefore the via-hole in the gate insulating layer 101 may provide a large contact area for the drain electrode 5 and the pixel electrode 1, thereby guaranteeing a good contact there between.

In some embodiments of the present disclosure, the technical solution of the present disclosure is described by taking the bottom-gate thin film transistor array substrate (as shown in FIG. 1), the top-gate thin film transistor array substrate (as shown in FIG. 2), and the coplanar top-gate thin film transistor array substrates (as shown in FIG. 3) as examples. It should be noted that, the technical solution of the present disclosure is also applicable to other kinds of array substrates, as long as only one insulating layer is arranged between the drain electrode of the thin film transistor and the pixel electrode, the via-hole formed in the insulating layer is a shallow via, and the drain electrode and the pixel electrode are in direct contact with each other through the via-hole.

Based on the same inventive concept, the present disclosure provides in some embodiments an array substrate manufactured by the methods hereinabove.

The array substrate includes a plurality of pixel regions. As shown in FIGS. 1-3, each of the pixel regions includes the thin film transistor and the pixel electrode 1 arranged on the substrate 100. The array substrate further includes the insulating layer 101 arranged between the drain electrode 5 of the thin film transistor and the pixel electrode 1. The via-hole is arranged in the insulating layer 101. The drain electrode 5 is in direct electrical contact with the pixel electrode 1 through the via-hole, so the connection between the drain electrode 5 and the pixel electrode 1 is good and the contact there between may not be poor, thereby improving the product yield.

Specifically, in the case that the drain electrode 5 is arranged at a side of the insulating layer 101 away from the substrate 100, part of the pixel electrode 1 is exposed through the via-hole in the insulating layer 101, and part of the drain electrode 5 is inserted into the via-hole and is in electrical contact with the pixel electrode 1. In the case that the drain electrode 5 is arranged at a side of the insulating layer 101 near the substrate 100, part of the drain electrode 5 is exposed through the via-hole in the insulating layer 101, and part of the pixel electrode 1 is inserted into the via-hole and is in electrical contact with the drain electrode 5.

Optionally, only one insulating layer 101 is arranged between the drain electrode 5 of the thin film transistor and the pixel electrode 1, and the via-hole formed in the insulating layer 101 is a shallow via-hole, so the undercutting, which is caused by etching multiple insulating layers, may not occur, thereby further guaranteeing a good transmission contact between the drain electrode 5 and the pixel electrode 1.

In some embodiments of the present disclosure, the insulating layer 101 between the drain electrode 5 of the thin film transistor and the pixel electrode 1 is a gate insulating layer.

Specifically, in order to simplify the manufacturing process and reduce the production cost, the gate insulating layer 101 and the active layer 6 of the thin film transistor may be formed by one patterning process, or the gate insulating layer 101 and the gate electrode 3 of the thin film transistor may be formed by one patterning process. For example, for the top-gate thin film transistor array substrate (as shown in FIG. 2) and the coplanar top-gate thin film transistor array substrate (as shown in FIG. 3), the gate insulating layer 101 and the gate electrode 3 of the thin film transistor are formed by one patterning process (specifically, the via-hole in the gate insulating layer 101 and the gate electrode 3 are formed by one patterning process). For the bottom-gate thin film transistor array substrate (as shown in FIG. 1), the gate insulating layer 101 and the active layer 6 of the thin film transistor are formed by one patterning process (specifically, the via-hole in the gate insulating layer 101 and the active layer 6 are formed by one patterning process).

Optionally, the gate insulating layer 101 is an organic film layer. The organic film layer is thick, then the via-hole formed therein may have a large size, therefore the via-hole in the gate insulating layer 101 may provide a large contact area for the drain electrode 5 and the pixel electrode 1, thereby guaranteeing a good contact there between.

The technical solution of the present disclosure will be described by taking the H-ADS array substrate as an example.

As shown in FIG. 1, taking the bottom-gate thin film transistor array substrate as an example, the H-ADS array substrate in some embodiments of the present disclosure includes:

the transparent base substrate 100, such as a glass substrate, a quartz resin substrate, and an organic resin substrate;

the plate-like pixel electrode 1 and the gate electrode 3 of the thin film transistor arranged on the substrate 100;

the gate insulating layer 101 covering the pixel electrode 1 and the gate electrode 3, where the via-hole is arranged in the gate insulating layer 101, through which part of the pixel electrode 1 is exposed;

the active layer 6 of the thin film transistor arranged on the gate insulating layer 101, where the via-hole in the gate insulating layer 101 and the active layer 6 may be formed by one patterning process;

the source electrode 4 and the drain electrode 5 of the thin film transistor, which are directly lapped onto the active layer 6, where part of the drain electrode 5 is inserted into the via-hole in the gate insulating layer 101 and is in direct electrical contact with the pixel electrode 1;

the passivation layer 102 covering entirely the substrate 100; and the slit common electrode 2 arranged on the passivation layer 102.

The structure of the top-gate thin film transistor array substrate may refer to FIG. 2, and the structure of the coplanar top-gate thin film transistor array substrate may refer to FIG. 3, and the detailed description thereof are omitted herein. The via-hole in the gate insulating layer 101 and the gate electrode 3 may be formed by one patterning process.

When the technical solution of the present disclosure is applied to other kinds of array substrates, the following arrangements are required: only one insulating layer is arranged between the drain electrode of the thin film transistor and the pixel electrode, the via-hole formed in the insulating layer is a shallow via, and the drain electrode and the pixel electrode are in direct contact with each other through the via-hole, other structures are the same as the related art. One of ordinary skill in the art will readily appreciate rational adjustments may be made to other structures based on the technical solution of the present disclosure, and these adjustments also fall within the scope of the present disclosure.

The present disclosure provides in some embodiments a display panel and a display device including the array substrate in some embodiments of the present disclosure, thereby guaranteeing a good electrical connection between the drain electrode and the pixel electrode and improving the product yield.

The display device may be any product or component having a display function such as an electronic paper, a mobile phone, a tablet computer, a television set, a display, a laptop computer, a digital photo frame and a navigator.

The above are merely some embodiments of the present disclosure. A person skilled in the art may make further replacements and improvements without departing from the principle of the present disclosure, and these replacements and improvements shall also fall within the scope of the present disclosure.

What is claimed is:

1. An array substrate, comprising a plurality of pixel regions, wherein each of the pixel regions comprises a thin film transistor and a pixel electrode arranged on a base substrate, the array substrate further comprises an insulating layer between a drain electrode of the thin film transistor and the pixel electrode, wherein the insulating layer comprises a via-hole through which the drain electrode is in direct electrical contact with the pixel electrode,
the insulating layer is a gate insulating layer,
the drain electrode of the thin film transistor is arranged at a side of the gate insulating layer close to the base substrate, and the pixel electrode is arranged at a side of the gate insulating layer away from the base substrate,
wherein the thin film transistor is a top-gate thin film transistor, and the array substrate further comprises:
the base substrate;
a source electrode and the drain electrode of the thin film transistor arranged on the base substrate;
an active layer, two ends of which are directly overlapped onto the source electrode and the drain electrode respectively;
the gate insulating layer covering the active layer, the source electrode and the drain electrode, wherein the gate insulating layer is provided with a via-hole exposing a part of the drain electrode;
a gate electrode of the thin film transistor arranged on the gate insulating layer;
a plate-like pixel electrode arranged on the gate insulating layer, wherein a part of the pixel electrode is inserted into the via-hole to be in direct electrical contact with the drain electrode;
a passivation layer covering the entire base substrate; and
a slit common electrode arranged on the passivation layer.

2. The array substrate according to claim 1, wherein the gate insulating layer is an organic film layer.

3. A display panel comprising the array substrate according to claim 1.

4. A display device comprising the array substrate according to claim 1.

5. A method of manufacturing an array substrate comprising a plurality of pixel regions, comprising:
providing a base substrate;
forming a thin film transistor and a pixel electrode in each of the pixel regions;
forming an insulating layer between a drain electrode of the thin film transistor and the pixel electrode;
forming the gate insulating layer and an active layer of the thin film transistor by one patterning process,
wherein the forming an insulating layer comprises:
forming in the insulating layer a via-hole through which the drain electrode is in direct electrical contact with the pixel electrode,
wherein the insulating layer is a gate insulating layer,
wherein the forming the gate insulating layer and an active layer of the thin film transistor by one patterning process further comprises:
forming a gate insulating layer and a semiconductor layer successively;
coating photoresist onto the semiconductor layer, exposing the photoresist using a grey tone mask plate or a halftone mask plate to form a photoresist fully-reserved region, a photoresist partially-reserved region and a photoresist fully-unreserved region, the photoresist fully-reserved region corresponds to a region of the active layer, the photoresist fully-unreserved region corresponds to a region of the via-hole, and the photoresist partially-reserved region corresponds to other regions;
removing the semiconductor layer and the insulating layer at the photoresist fully-unreserved region to form the via-hole;
removing the photoresist at the photoresist partially-reserved region through an ashing process;
removing the semiconductor layer at the photoresist partially-reserved region; and
peeling off a remaining part of the photoresist to form the active layer of the thin film transistor.

6. The method according to claim 5, wherein the thin film transistor is a bottom-gate thin film transistor, and the method comprises:
providing a base substrate;
forming a plate-like pixel electrode and a gate electrode of the thin film transistor on the substrate;
forming a gate insulating layer covering the pixel electrode and the gate electrode;
forming a semiconductor layer on the insulating layer, performing a patterning process to the semiconductor layer and the gate insulating layer to form the active layer of the thin film transistor, and forming the via-hole in the gate insulating layer to expose a part of the pixel electrode;
forming a source electrode and the drain electrode of the thin film transistor, wherein the source electrode and the drain electrode are directly overlapped onto the active layer, a part of the drain electrode is inserted into the via-hole to be in direct electrical contact with the pixel electrode;
forming a passivation layer covering the entire base substrate; and
forming a slit common electrode on the passivation layer.

7. A method of manufacturing an array substrate comprising a plurality of pixel regions, comprising:
providing a base substrate;
forming a thin film transistor and a pixel electrode in each of the pixel regions;
forming an insulating layer between a drain electrode of the thin film transistor and the pixel electrode;
forming the gate insulating layer and a gate electrode of the thin film transistor by one patterning process;
wherein the forming an insulating layer comprises:
forming in the insulating layer a via-hole through which the drain electrode is in direct electrical contact with the pixel electrode,
wherein the insulating layer is a gate insulating layer,
wherein the thin film transistor is a top-gate thin film transistor, and the method further comprises:
providing a base substrate;
forming a source electrode and the drain electrode of the thin film transistor on the base substrate;
forming an active layer, two ends of which are directly overlapped onto the source electrode and the drain electrode respectively;
forming the gate insulating layer covering the active layer, the source electrode and the drain electrode;
forming a gate metal layer on the gate insulating layer, performing a patterning process to the gate insulating layer and the gate metal layer to form the gate electrode of the thin film transistor, and forming the via-hole in the gate insulating layer to expose a part of the drain electrode;
forming a plate-like pixel electrode on the gate insulating layer, wherein a part of the pixel electrode is inserted into the via-hole to be in direct electrical contact with the drain electrode;

forming a passivation layer covering the pixel electrode and the pixel electrode; and forming a slit common electrode on the passivation layer.

8. The method according to claim 7, wherein the forming the gate insulating layer and a gate electrode of the thin film transistor by one patterning process further comprises:

forming the gate insulating layer and a gate metal layer successively;

coating the gate metal layer with a photoresist, exposing the photoresist using a grey tone mask plate or a halftone mask plate to form a photoresist fully-reserved region, a photoresist partially-reserved region and a photoresist fully-unreserved region, wherein the photoresist fully-reserved region corresponds to a region of the gate electrode, the photoresist fully-unreserved region corresponds to a region of the via-hole, and the photoresist partially-reserved region corresponds to other regions;

removing the gate insulating layer and the gate insulating layer at the photoresist fully-unreserved region to form the via-hole;

removing the photoresist at the photoresist partially-reserved region through an ashing process;

removing the gate metal layer at the photoresist partially-reserved region; and peeling off a remaining part of the photoresist to form the gate electrode of the thin film transistor.

\* \* \* \* \*

UNITED STATES PATENT AND TRADEMARK OFFICE
CERTIFICATE OF CORRECTION

PATENT NO. : 10,254,609 B2
APPLICATION NO. : 15/525979
DATED : April 9, 2019
INVENTOR(S) : Shoukun Wang et al.

Page 1 of 1

It is certified that error appears in the above-identified patent and that said Letters Patent is hereby corrected as shown below:

In the Claims

Column 11, Lines 19-20, Claim 8:
After "removing the gate insulating layer and the gate"
Delete "insulating layer", and
Insert --metal layer--.

Signed and Sealed this
Twenty-fourth Day of September, 2019

Andrei Iancu
*Director of the United States Patent and Trademark Office*